United States Patent [19]

Hayakawa et al.

[11] Patent Number: 4,629,676
[45] Date of Patent: Dec. 16, 1986

[54] IMAGE FORMING METHOD

[75] Inventors: Yoshihide Hayakawa, Tokyo; Masato Satomura; Kozo Sato, both of Kanagawa, all of Japan

[73] Assignee: Fuji Photo Film Co., Ltd., Japan

[21] Appl. No.: 775,273

[22] Filed: Sep. 12, 1985

[30] Foreign Application Priority Data

Sep. 12, 1984 [JP] Japan ................................. 59-191353
Sep. 18, 1984 [JP] Japan ................................. 59-195407

[51] Int. Cl.[4] .......................... G03C 1/40; G03C 5/54; G03F 7/00
[52] U.S. Cl. ..................................... 430/203; 430/199; 430/292; 430/325; 430/330; 430/351
[58] Field of Search ............... 430/203, 330, 351, 353, 430/617, 619, 292, 325, 199

[56] References Cited

U.S. PATENT DOCUMENTS 3,438,776  4/1969  Yudelson ............................. 430/617
3,687,667  8/1972  Hayakawa et al. ................. 430/324
4,547,450 10/1985  Maeda et al. ....................... 430/269

Primary Examiner—Richard L. Schilling
Attorney, Agent, or Firm—Sughrue, Mion, Zinn, Macpeak, and Seas

[57] ABSTRACT

An image forming method is disclosed, comprising forming a latent image by imagewise exposing a recording material including a light-sensitive silver salt, a reducing agent, a polymerizable compound, and a binder, on a support, and subsequently subjecting said recording material to a substantially uniform heating at about 80° C. or more under conditions substantially not containing water, thereby forming a polymeric compound in areas where the latent image of the light-sensitive silver salt has formed.

19 Claims, No Drawings

IMAGE FORMING METHOD

FIELD OF THE INVENTION

The present invention relates to an image forming method. More particularly, the invention relates to an image forming method utilizing heat for forming a polymeric compound in areas where silver salt grains carrying a latent image are present.

BACKGROUND OF THE INVENTION

The present inventors have developed several techniques for forming a polymeric compound, especially in an imagewise pattern, by making use of the high light-sensitive property of light-sensitive silver salts. One such technique is described in detail in Japanese Patent Publication No. 20741/72 (corresponding to U.S. Pat. No. 3,687,667), Japanese Patent Application (OPI) Nos. 138632/82 (corresponding to U.S. Ser. No. 687,481 filed on Feb. 18, 1982) and 121031/83 (corresponding to U.S. Ser. No. 457,602 filed on Jan. 13, 1983) (the term "OPI" as used herein refers to a "published unexamined Japanese patent application").

The basic idea disclosed in this publication was to treat an exposed silver halide photographic emulsion with an aqueous solution of a reducing agent in the presence of an addition polymerizable compound, and to use the resulting intermediate product of the reaction as a polymerization initiator.

In the above type of technique, selective formation of a polymeric compound in areas having a latent image is realized by simultaneously carrying out the wet development and polymerization reaction, and the development processing is required. In other words, processing under wet conditions has been indispensable to the above conventional techniques, and at least about 1 minute has been necessary for completion of the intended polymerization reaction.

SUMMARY OF THE INVENTION

In order to overcome the problems involved in the techniques described above, the present invention provides an image forming method which comprises forming a latent image by imagewise exposing a recording material including a light-sensitive silver salt, a reducing agent, a polymerizable compound, and a binder, on a support, and subsequently subjecting said recording material to a substantially uniform heating at about 80° C. or more under conditions substantially not containing water, thereby forming a polymeric compound in areas where the latent image of the light-sensitive silver salt has formed.

The image forming method according to the present invention does not substantially form a polymeric compound by the imagewise exposure, but can form a polymeric compound in an imagewise pattern by heating.

One particular advantage of the present invention is that an image can be formed by processing under dry conditions. It was entirely unexpected that areas having a latent image could be selectively developed as a result of cross-linking or polymerization reaction accelerated by heating the system to 80° C. or higher.

DETAILED DESCRIPTION OF THE INVENTION

In accordance with the present invention, a polymeric compound may be formed in a pattern which corresponds to either the exposed or unexposed area depending upon the type of light-sensitive silver salts used. The area where the polymeric compound has formed generally has a higher resistance to water, solvents, heat and pressure and a higher viscosity than the area having no such polymeric compound, and as a result, this latter area can be washed off to form a color image or transferred to an image receiving material by heating or pressure application so as to form a color image. Further, the color image can be formed by incorporating a color image forming material in the polymeric image forming layer used in the method of the present invention. Therefore, in accordance with the present invention, not only a negative image but also a positive image with respect to the original can be produced depending upon the type of light-sensitive silver salts used or the process of color image formation employed. If desired, negative and positive images can be formed simultaneously.

If, for example, a color image is to be obtained by transferring the area where no polymeric compound has formed, a positive image with respect to the original can be obtained by using an ordinary negative working silver halide emulsion. A negative image can be obtained either by using internal image forming silver halide emulsions of the type described in U.S. Pat. Nos. 2,592,250, 3,206,313, 3,367,778 and 3,447,927, or by using a combination of surface image forming silver halide emulsion and internal image forming silver halide emulsion as described in U.S. Pat. No. 2,996,382.

The silver halides that can be used in the present invention include silver chloride, silver bromide, silver iodide, as well as silver chlorobromide, silver chloroiodide, silver iodobromide, and silver chloroiodobromide. The halide composition may be uniform throughout the bulk of the grains or may differ as between the grain surface and interior so as to provide a covered grain structure (see Japanese Patent Application (OPI) Nos. 154232/82, 108533/83, 48755/84, 52237/84, U.S. Pat. No. 4,433,048, and European Pat. No. 100,984). The silver halide grains may be plates that are not thicker than 0.5 micron and have diameters of at least 0.6 micron with an average aspect ratio of at least 5 (see, for example, U.S. Pat. Nos. 414,310 and 4,435,499 and West German (OLS) 3,241,646 A1). Also usable are monodisperse emulsions having an approximately uniform grain size distribution (see, for example, Japanese Patent Application (OPI) Nos. 178235/82, 100846/83, 14829/83, International Patent (PCT) Application WO 83/02338 A1, and European Pat. Nos. 64,412 A3 and 83,377 A1). Two or more silver halide grains having different crystal habits, halide compositions, grain sizes and size distributions may also be used. Tone gradation may be achieved by using a mixture of two or more monodispersed emulsions having different grain sizes.

The silver halide grains used in the present invention preferably have average sizes in the range of 0.001 to 10 μm, with those having average sizes between 0.001 and 5 μm being particularly preferred. Emulsions incorporating such silver halide grains may be prepared by any of the acidic, neutral, and ammoniacal methods. The soluble silver salts may be reacted with the soluble halide salts by either the single jet method, the double jet method, or a combination of these methods. Also, usable are the reverse jet methods wherein grains are formed in excess of silver ions, and the controlled double jet method wherein pAg is held constant. In order to increase the rate of grain growth, the concentrations of silver salts and halide salts added, the amounts of these additions or their addition rate may be increased (see, for example, Japanese Patent Application (OPI) Nos. 142329/80 (corresponding to U.S. Pat. No. 4,301,241) and 158124/80 and U.S. Pat. No. 3,650,757.

Composite silver halide grains comprised of silver chloride crystals forming epitaxial junctions with silver iodide crystals may also be used (see Japanese Patent Application (OPI) No. 16124/81 and U.S. Pat. No. 4,094,684).

When silver halides are used independently in the present invention in the absence of silver salt oxidizing agents, the silver halides are preferably silver chloroiodide, silver iodobromide, and silver chloroiodobromide of a type wherein an X-ray pattern of the silver iodide crystals is clearly discernible. For example, silver iodobromide having such characteristics can be obtained by first preparing silver bromide grains by addition of a silver nitrate solution to a solution of potassium bromide, and then adding potassium iodide to the resulting silver iodide grains.

In the stage of forming silver halide grains intended for use in the present invention, ammonia, the organic thioether derivatives described in Japanese Patent Publication No. 11386/72 (corresponding to U.S. Pat. No. 3,574,628) and the sulfur-containing compounds described in Japanese Patent Application (OPI) No. 144319/78 (corresponding to British Pat. No. 1,586,412) may be used as solvents for silver halides. The formation of silver halide grains or their physical ripening may be carried out in the presence of cadmium, zinc, lead or thallium salts.

In order to improve a high or low-intensity reciprocity failure, water-soluble iridium salts such as iridium (III) or (IV) chloride and ammonium hexachloroiridate (IV), or water-soluble rhodium salts such as rhodium chloride may be used.

After precipitation of grains or their physical ripening, soluble salts may be removed from the silver halide emulsion either by such washing procedures as noodle washing or by flocculation washing. The silver halide emulsions may be used without ripening but are more commonly used after chemical sensitization. Any sensitization methods such a sulfur sensitization, reduction sensitization, and noble metal sensitization, that is known in the art of conventional photographic materials may be used, either independently or in combination. Such chemical sensitizations may be effected in the presence of nitrogen-containing heterocyclic compounds (see Japanese Patent Application (OPI) Nos. 126526/83 and 215644/83).

The silver halide emulsions used in the present invention may be of the surface type wherein a latent image is formed predominantly on the surface of grains, or of the internal type wherein a latent image is formed predominantly in the interior of grains. Direct reversal emulsions which combine an internal latent image type emulsion with a nucleating agent may be used. Internal latent image type emulsions adapted to this purpose are described in U.S. Pat. Nos. 2,595,250 and 3,761,276, Japanese Patent Publication No. 3534/83 and Japanese Patent Application (OPI) No. 136641/82. Illustrative nucleating agents that are preferably combined with such internal latent image type emulsions are described in U.S. Pat. Nos. 3,227,552, 4,245,037, 4,255,511, 4,266,013, 4,276,364, and West German (OLS) No. 2,635,316.

In accordance with the present invention, the light-sensitive silver halide may be preferably used in combination with silver salt oxidizing agents which are fairly stable against light. In this case, the light-sensitive silver halides must be in contact with or in close proximity with the silver salt oxidizing agents. At temperatures of 80° C. or higher, preferably at 100° C. or higher, the silver salt oxidizing agents are believed to take part in the redox reaction as catalyzed by the latent image on the silver halide grains.

Illustrative organic compounds that can be used in the formation of such silver salt oxidizing agent include aliphatic or aromatic carboxylic acids, thiocarbonyl group containing compounds having a mercapto group or α-hydrogen, and imino group containing compounds.

Typical examples of the silver salts of aliphatic carboxylic acids are those which are derived from behenic acid, stearic acid, oleic acid, lauric acid, capric acid, myristic acid, palmitic acid, maleic acid, fumaric acid, tartaric acid, furoic acid, linoleic acid, linolenic acid, oleic acid, adipic acid, sebacic acid, succinic acid, acetic acid, butyric acid and camphoric acid. Also usable are silver salts derived from halogen- or hydroxyl-substituted aliphatic acids mentioned above, or aliphatic carboxylic acids containing a thioether group.

Typical examples of the silver salts of aromatic carboxylic acids and other carboxyl group containing compounds include those which are derived from benzoic acid, 3,5-dihydroxybenzoic acid, o-, m- or p-methylbenzoic acid, 2,4-dichlorobenzoic acid, acetamidobenzoic acid, p-phenylbenzoic acid, gallic acid, tannic acid, phthalic acid, terephthalic acid, salicylic acid, phenylacetic acid, pyromellitic acid and 3-carboxymethyl-4-methyl-4-thiazoline-2-thione.

Illustrative silver salts of mercapto or thiocarbonyl group containing compounds include those which are derived from dithiocarboxylic acids such as 3-mercapto-4-phenyl-1,2,4-triazole, 2-mercaptobenzimidazole, 2-mercapto-5-aminothiadiazole, 2-mercaptobenzothiazole, S-alkylthioglycolic acids (containing from 12 to 22 carbon atoms in the alkyl group) and dithioacetic acid; thioamides such as thiostearoamide; and mercapto compounds such as those described in U.S. Pat. No. 4,123,274, e.g., 5-carboxy-1-methyl-2-phenyl-4-thiopyridine, mercaptotriazine, 2-mercaptobenzoxazole, mercaptooxadiazole and 3-amino-5-benzylthio-1,2,4-triazole.

Typical examples of the silver salts of imino group-containing compounds include those derived from benzotriazole and derivatives thereof as described in Japanese Patent Publication Nos. 30270/69 (corresponding to British Pat. No. 1,173,426) and 18416/70 (corresponding to U.S. Pat. No. 3,635,719), such as alkyl-substituted benzotriazoles (e.g., benzotriazole and methylbenzotriazole), halogen-substituted benzotriazoles (e.g., 5-chlorobenzotriazole), and carboimidobenzotriazoles (e.g., butyl carboimidobenzotriazole); nitrobenzotriazoles as described in Japanese Patent Application (OPI) No. 118639/83; sulfobenzotriazole, carboxybenzotriazole, salts thereof, and hydroxybenzotriazole as described in Japanese Patent Application (OPI) No. 118638/83; and 1,2,4-triazole, 1H-tetrazole, carbazole, saccharin, imidazoles and derivatives thereof as described in U.S. Pat. No. 4,220,709.

Also usable in the present invention are silver salts or organic metal salts other than silver salts such as copper stearate, as described in Research Disclosure, RD No.

17029, June, 1978, and silver salts of alkynyl group containing carboxylic acids such as phenylpropiolic acid as described in Japanese Patent Application No. 221535/83.

The silver salt oxidizing agent described above may be usually used in amounts ranging from 0.01 to 10 mols, and preferably from 0.01 to 1 mol, per mol of the light-sensitive silver halide. The coating weight of the light-sensitive silver halide or the total coating weight of the light-sensitive silver halide and silver salt oxidizing agent generally ranges from 1 mg to 10 g/m$^2$, as silver.

The silver halides used in the present invention may be spectrally sensitized with dyes, which include methine dyes, cyanine dyes, merocyanine dyes, complex cyanine dyes, complex merocyanine dyes, holopolar cyanine dyes, hemicyanine dyes, styryl dyes and hemioxonol dyes. Particularly useful dyes are those which belong to cyanine dyes, merocyanine dyes and complex merocyanine dyes. These dyes may employ any of the nuclei that are conventionally used in cyanine dyes as basic heterocyclic nuclei. Suitable nuclei include pyrroline nucleus, oxazoline nucleus, thiazoline nucleus, pyrrole nucleus, oxazole nucleus, thiazole nucleus, selenazole nucleus, imidazole nucleus, tetrazole nucleus and pyridine nucleus; nuclei wherein alicyclic hydrocarbon rings are fused to such nuclei; and nuclei wherein aromatic hydrocarbon rings are fused to such nuclei, for example, indolenine nucleus, benzindolenine nucleus, indole nucleus, benzoxazole nucleus, naphthoxazole nucleus, benzothiazole nucleus, naphthothiazole nucleus, benzoselenazole nucleus, benzimidazole nucleus and quinoline nucleus. These nuclei may have substituents on the carbon atoms thereof.

Merocyanine or complex merocyanine dyes may incorporated nuclei having a ketomethylene structure, such as 5- or 6-membered heterocyclic nuclei as illustrated by pyrazoline-5-one nucleus, thiohydantoin nucleus, 2-thioxazolidine-2,4-dione nucleus, thiazolidine-2,4-dione nucleus, rhodanine nucleus, and thiobarbituric acid nucleus.

The sensitizing dyes listed above may be used independently, but more frequently they are used in combination particularly for the purpose of supersensitization.

In addition to the sensitizing dyes, the emulsions may incorporate dyes which do not exhibit sensitizing effects by themselves or those substances which are substantially incapable of absorbing visible light, but which exhibit supersensitizing effects. Examples of such additional dyes or subtances include aminostyryl compounds substituted by a nitrogen-containing heterocyclic group (e.g., U.S. Pat. Nos. 2,933,390 and 3,635,721), condensation products of aromatic organic acids and formaldehyde (e.g., U.S. Pat. No. 3,743,510), cadmium salts, and azaindene compounds. Particularly useful combinations are described in U.S. Pat. Nos. 3,615,613, 3,615,641, 3,617,295, and 3,635,721.

Illustrative reducing agents that can be used in the present invention include compounds which are described in Japanese Patent Publication Nos. 11149/70 (corresponding to U.S. Pat. No. 3,697,275) (resorcins), 6581/71 (m-aminophenols), 14667/72 (5-pyrazolones), 14668/72 (corresponding to U.S. Pat. No. 3,782,943) (alkylphenols), 14669/72 (corresponding to U.S. Pat. No. 3,697,273) (alkoxynaphthols), 20741/72 (corresponding to U.S. Pat. No. 3,687,667) (m-phenylenediamines), 1569/74 (corresponding to British Pat. No. 1,284,461) (naphthols), 10697/74 (corresponding to U.S. Pat. No. 3,746,542) (hydrazines), and 138632/82, Japanese Patent Application (OPI) Nos. 142638/82 and 176033/82, and U.S. Pat. No. 3,585,030.

More specific examples of the reducing agents are listed below:

resorcin, 2-methylresorcin, orcine, fluoroglucine, fluoroglucine monomethyl ether, fluoroglucine dimethyl ether, m-aminophenol, m-dimethylaminophenol, m-diethylaminophenol, N,N-dimethyl-m-phenylenediamine, N,N-diethyl-m-phenylenediamine, 3-methyl-5-pyrazolone, 3,4-dimethyl-5-pyrazolone, 1,3-dimethyl-5-pyrazolone, 1-phenyl-3-methyl-5-pyrazolone, p-ethylphenol, p-dodecylphenol, p-methoxyphenol, p-benzyloxyphenol, p-hydroxydiphenylether, 4-methyl-1-naphthol, 2-methyl-1-naphthol, 1-methyl-2-naphthol, 6-amino-1-naphthol, 8-amino-2-naphthol, 1,3-dihydroxynaphthalene, 4-methoxy-1-naphthol, o-tolylhydrazine hydrochloride, p-tolylhydrazine hydrochloride, acetohydrazide, benzhydrazide, toluenesulfonylhydrazine, N,N'-diacetylhydrazine, β-acyl-phenylhydrazine, e.g., β-acetylphenylhydrazine, β-acetyl-p-tolylhydrazine, β-acetyl-p-methoxyphenylhydrazine, β-acetyl-p-aminophenylhydrazine, β-formyl-p-aminophenylhydrazine, β-formyl-2,4-dimethylphenylhydrazine, β-benzoyl-2,4-dimethoxyphenylhydrazine, β-butyroyl-p-tolylhydrazine, β-pivaloyl-p-acetylaminophenylhydrazine, β-propionyl-p-dimethylaminophenylhydrazine, β-ethoxycarbonyl-p-aminophenylhydrazine, β-dimethylcarbamoyl-p-benzenesulfonamidephenylhydrazine, β-morpholinocarbonyl-p-aminophenylhydrazine, etc.

These reducing agents may be used in combination if desired. They may also be used in combination with reducing agents used in conventional photography, such as hydroquinone, catechol, p-substituted aminophenols, p-phenylenediamines and 3-pyrazolidones. While the amounts of the reducing agents added may vary over a broad range, they are preferably added in amounts of from 0.1 to 1,500 mol%, and more preferably from 10 to 300 mol%, based on the total mols of the silver salt (when using the silver salt oxidizing agent, its amount is a total amount thereof).

The polymerizable compounds that can be used in the present invention include addition polymerizable monomers, oligomers, and polymers thereof. Usable addition polymerizable monomers include those compounds which have at least one carbon-carbon unsaturated bond. Examples of such compounds include acrylic acid and salts thereof, acrylic acid esters, acrylamides, methacrylic acid and salts thereof, methacrylic acid esters, methacrylamides, maleic anhydride, maleic acid esters, itaconic acid esters, styrenes, vinyl ethers, vinyl esters and N-vinyl heterocyclic compounds, and derivatives of such compounds.

While any of the compounds listed above are useful as polymerizable compounds, particularly preferred for the purposes of the present invention wherein thermal development is conducted are those which boil at 80° C. or above, i.e., those that are not easily volatilized upon heating. In order to provide a color image having high S/N (signal/noise) ratio, the polymerizable compounds are desirably used in combination with cross-linkable compounds capable of enhancing the viscosity or hardness of the resulting polymeric compound. The "cross-linkable compounds" are defined as polyfunctional monomers having a plurality of vinyl or vinylidene groups in the molecule. Preferred examples of the polymerizable compounds for use in the present invention include acrylic acid, methacrylic acid, butyl acrylate methoxyethyl acrylate, butyl methacrylate, acrylamide, N,N-dimethylacrylamide, N,N-diethylacrylamide, N-acryloylmorpholine, N-acryloylpiperidine, glycidyl acrylate, 2-ethylhexyl acrylate, acrylic acid anilide, methacrylic acid anilide, styrene, vinyltoluene, chlorostyrene, methoxystyrene, chloromethyl styrene, 1-vinyl-2-methylimidazole, 1-vinyl-2-undecylimidazole, 1-vinyl-2-undecylimidazoline, N-vinylpyrrolidone, N-vinylcarbazole, vinyl benzyl ether, vinyl phenyl ether, methylene-bisacrylamide, trimethylene-bisacrylamide, hexamethylene-bisacrylamide, N,N'-diacryloylpiperazine, m-phenylene-bisacrylamide, p-phenylene-bisacrylamide, ethylene glycol diacrylate, propylene glycol dimethacrylate, diethylene glycol diacrylate, polyethylene glycol diacrylate, bis(4-acryloxypolyethoxyphenyl)propane, 1,5-pentanediol diacrylate, neopentyl glycol diacrylate, 1,6-hexanediol acrylate, polypropylene glycol diacrylate, pentaerythritol triacrylate, trimethylolpropane triacrylate, pentaerythritol tetraacrylate, N-methylolacrylamide, diacetone acrylamide, and triethylene glycol dimethacrylate.

Also usable in the present invention are polymeric compounds having a vinyl or vinylidene group, such as the products of condensation between acrylic or methacrylic acid and polymeric compounds having a hydroxyl, amino, epoxy, halogen, or sulfonyloxy group in a side chain.

Polymerizable compounds wherein a vinyl or vinylidene group is attached to the structural nuclei of the reducing agents listed above may also be used, and examples are m-N,N-di(acryloyloxyethyl)aminophenol and p-acryloyloxyethoxyphenol. In this case, one compound serves both as a reducing agent and as a polymerizable compound. Color image forming materials such as those compounds having a vinyl group in dyes, for instance, leuco dyes, may also be used as the polymerizable compounds, and in this case, one compound works both as a polymerizable compound and a color image forming material.

The polymerizable compound in accordance with the present invention are generally used in amounts ranging from 5 to 120,000 wt%, preferably from 100 to 10,000 wt%, based on the total weight of the silver in the light-sensitive silver salts (when using the silver salt oxidizing agent, its amount is a total amount thereof).

Various color image forming materials may be used in the present invention. Dyes and pigments are examples of such materials in the colored form. When dyes or pigments are used, color images can be formed either by washing off the areas where no polymeric compound has formed or by transferring such areas to an image receiving material by a suitable technique. The dyes or pigments that can be used in the present invention are either commercially available or described in a variety of literature references, such as *Senryo Binran* (*Handbook of Dyestuffs*), edited by the Society of Synthetic Organic Chemistry, Japan, 1970, and *Saishin Ganryo Binran* (*New Handbook of Pigments*), edited by the Society of Pigment Technology, Japan, 1977. The dyes or pigments described above are used as solutions or dispersions.

The color image forming materials in the uncolored form are classified into two groups, one including compounds which are themselves colorless or pale-colored but which develop color upon receiving energy of some form, such as by heating, pressure application or exposure to light, and the other comprising compounds which will not themselves develop color upon application of any energy but which will develop color by contact with other components. Known examples of the compounds in the first group include thermochromic compounds, piezochromic compounds, photochromic compounds, as well as leuco forms of triarylmethane dyes, quinone dyes, indigoid dyes, and azine dyes. These compounds will develop color either by heating, pressure application, exposure to light, or by aerial oxidation.

Various systems are included in the second group, which develop color upon the acid base reaction, oxidation reduction reaction, coupling reaction or chelate forming reaction that occurs between two or more components. More specific examples are described below: color developing systems of the types used in pressure-sensitive paper, etc., which comprise a color former having a partial structure of lactone, lactam or spiropyran and a color developer made of an acidic substance such as acid clay or phenol; systems using the azo coupling reaction between aromatic diazonium salts, diazotates or diazosulfonates and naphthols, anilines or active methylenes; systems using such chelate forming reactions such as the one between hexamethylenetetramine, ferric ions and gallic acid, and the one between phenolphthalein-complexons and alkaline earth metal ions; and systems using such oxidation reduction reactions, such as the one between ferric stearate and pyrogallol and the one between silver behenate and 4-methoxy-1-naphthol.

If the color image forming material used in the present invention fulfills its function by utilizing the reaction between two or more componennts, such components are desirably isolated from each other in the termal solvents. While various techniques may be employed for achieving this purpose, one method is to incorporate one component in a light-sensitive layer and the other component in an receiving element, forming a color image by transferring to the image receiving material having a receiving element the unhardened component wherein no polymeric compound has formed. Alternatively, a polymerizable compound and one component of color image forming materials may be incorporated in capsules, and then the receiving elements are introduced into the same layer so they are present in spaced relation with each other. Another method may be to incorporate the respective components and receiving element in adjacent layers forming individual sub-layers of a multiple layer light-sensitive layer.

In accordance with the present invention, the color image forming material is coated so that its amount ranges from 0.1 to 5 g/m$^2$ in the colored state, i.e., the maximum amount of the dye in the colored state to form an image is 0.1 to 5 g/m$^2$.

In order to obtain a broad range of colors in the chromaticity diagram using the three primary colors for the subtractive process (i.e., yellow, magenta and cyan), the light-sensitive material used in the present invention must have at least three silver halide emulsions having sensitivity to different spectral regions. Typical examples of the combinations of at least three silver halide emulsions that have sensitivity to different spectral regions include the following: the combination of a blue-sensitive emulsion, a green-sensitive emulsion and a red-sensitive emulsion; the combination of a green-sensitive emulsion, a red-sensitive emulsion and an infrared-sensitive emulsion; the combination of a blue-sensitive emulsion, a green-sensitive emulsion and an infrared-sensitive emulsion; and the combination of a blue-sensitive emulsion, a red-sensitive emulsion and an infrared-sensitive emulsion. An "infrared-sensitive emulsion" as used herein means an emulsion having sensitivity to light at wavelengths of 700 nm or longer, and preferably at 740 nm or longer.

If the combination of blue-, green- and red-sensitive emulsions is used, the respective sensitive portions may incorporate yellow-, magenta- and cyan-image forming materials. In this case, a mixture of the blue-sensitive emulsion, polymerizable compound and yellow-image forming material is desirably isolated from each of the mixture of the green-sensitive emulsion, polymerizable compound and magenta-image forming material, and the mixture of the red-sensitive emulsion, polymerizable compound and cyan-image forming material. Two methods are available for isolating these mixtures from each other; one is to coat the layers of mixtures on a support in a superimposed fashion, and the other is to form packet emulsions from the respective mixtures and coat them on the same layer. The latter method is preferred if an image is to be obtained by transferring the color-image forming materials onto an image receiving material, and details of the method for preparing packet emulsions will be found in Japanese Patent Application (OPI) No. 40551/83. If a packet emulsion is used, the reducing agent may be present either inside or outside the packet.

Various accelerators may be used in the present invention for the purpose of accelerating the reaction between silver salts and reducing agents. Accelerators are compounds which accelerate development by rendering the reaction system basic, and two types of accelerators are known, i.e., bases and base precursors. A variety of bases and base precursors are known. Base precursors are compounds which release base components upon heating, and the base components released may be inorganic or organic.

Preferred inorganic bases include hydroxide, secondary or tertiary phosphate, borate, carbonate, quinolinate and metaborate of alkali metals or alkaline earth metals; ammonium hydroxide; hydroxide of quaternary alkylammoniums; and other metal hydroxides. Preferred organic bases include aliphatic amines (e.g., trialkylamines, hydroxylamines and aliphatic polyamines), aromatic amines (e.g., N-alkyl-substituted aromatic amines, N-hydroxyalkyl-substituted aromatic amines and bis[p-(dialkylamino)phenyl]methanes), heterocyclic amines, amidines, cyclic amidines, guanidines and cyclic guanidines. Bases having pKa values of 8 or more are particularly preferred.

Such bases are preferably incorporated in the light-sensitive material in the form of their precursors. Preferred base precursors are those which release bases as a result of certain reactions caused by heating, and illustrative examples are salts of bases and organic acids that decompose by giving up carbon dioxide upon heating, as well as compounds that release amines as a result of decomposition caused by the intramolecular nucleophilic substitution reaction, the Lossen rearrangement, or the Beckman rearrangement. Specific examples of the preferred base precursors include the salts of trichloroacetic acid described in British Pat. No. 998,949, the salts of α-sulfonylacetic acid described in U.S. Pat. No. 4,060,420, the salts of propiolic acid described in Japanese Patent Application No. 55700/83, the 2-carboxycarboxamide derivatives described in U.S. Pat. No. 4,088,496, the salts with heat decomposable acids using an alkali metal or alkaline earth metal as the base component in addition to organic bases (Japanese Patent Application No. 69597/83), hydroxamic acid carbamates using the Lossen rearrangement as described in Japanese Patent Application No. 43860/83, and aldoxime carbamates that yield nitrile upon heating as described in Japanese Patent Application No. 31614/83. Other usable base precursors are described in British Pat. No. 998,945, U.S. Pat. No. 3,220,846, Japanese Patent Application (OPI) No. 22625/75, and British Pat. No. 2,079,480.

Specific examples of the base precursors which are particularly preferred for the purposes of the present invention include trichloroacetic acid guanidine, trichloroacetic acid methylguanidine, potassium trichloroacetate, guanidine phenylsulfonylacetic acid, guanidine p-chlorophenylsulfonylacetic acid, guanidine p-methanesulfonylphenylsulfonylacetic acid, potassium phenylpropiolate, cesium phenylpropiolate, guanidine phenylpropiolic acid, guanidine p-chlorophenylpropiolic acid, guanidine 2,4-dichlorophenylpropiolic acid, diguanidine p-phenylenebispropiolic acid, tetramethylammonium phenylsulfonylacetate, and tetramethylammonium phenylpropiolate.

The base precursors listed above may be used either individually or in combination.

The amounts of the bases or base precursors described above may vary over a wide range. A useful range is up to 50 wt% of the weight of a dry coating of the light-sensitive material, and the range of 0.01 to 40 wt% is particularly preferred.

In accordance with the present invention, the reducing agent, polymerizable compound, and color image forming material may be introduced into layers in the light-sensitive material or image receiving material by a variety of methods. In one method, the materials mentioned above are dissolved in water or a hydrophilic organic solvent and the resulting solution is coated directly onto a support, optionally together with a suitable binder. Known methods such as the one described in U.S. Pat. No. 2,322,027 may be used to incorporate such materals into layers in the light-sensitive material. High and low boiling organic solvents that may be used in forming coating solutions for the reducing agent, polymerizable compound, and color image forming material include high boiling organic solvents such as alkyl esters of phthalic acid (e.g., dibutyl phthalate and dioctyl phthalate), phosphate esters (e.g., diphenyl phosphate, triphenyl phosphate, tricresyl phosphate and dioctyl butyl phosphate), citrate esters (e.g., tributyl acetylcitrate), benzoate esters (e.g., octyl benzoate), alkylamides (e.g., diethyllaurylamide), aliphatic acid esters (e.g., dibutoxyethylsuccinate and dioctyl azelate), and trimesic acid esters (e.g., tributyl trimesate), and organic solvents having boiling points of about 30° to 160° C., such as lower alkyl acetates (e.g., ethyl acetate and butyl acetate), ethyl propionate, secondary butyl alcohol, methyl isobutyl ketone, β-ethoxyethyl acetate, methyl cellosolve acetate, and cyclohexanone. solutions of these solvents are subsequently dispersed in hydrophilic colloids. The high boiling organic solvents may be used in combination with the low boiling organic solvents.

The dispersion techniques using polymers that are described in Japanese Patent Publication No. 39853/76 and Japanese Patent Application (OPI) No. 59943/76 may also be used. A variety of surfactants may be used as aids for dispersing in hydrophilic colloids.

The reducing agent, polymerizable compound and color image forming material may be encapsulated for coating onto a support, and this method is particularly preferred for the purpose of obtaining a high quality image. Solvents are desirably used in the formation of capsules. In addition to the high boiling and low boiling organic solvents listed above, phenylalkanes and chlorinated paraffins are preferably used as solvents. Individual capsules preferably contain for about 5 to 95 wt% of the polymerizable compound and from about 0.1 to 15 wt% of the color image forming material.

Capsule walls are preferably formed by the coacervation of gelatin, or they may be formed of polyurea, polyurethane, polyesters, thermosetting polymers or mixtures thereof. Capsules having a uniform size which are surrounded by dense walls and will keep for a long time may be obtained by polymer precipitation or by encapsulation techniques using the polymerization of reactants from within oil droplets. Details of encapsulation techniques that can be used in the present invention are described in U.S. Pat. Nos. 3,276,804 and 3,796,669.

The capsules generally have a size of not more than 80 μm, and in order to ensure ease of handling during storage, capsules having a particle size not larger than 20 μm are preferred. From the viewpoint of the danger of easy rupture upon pressure application, capsules having a particle size not smaller than 0.1 μm are desired. In other words, the desirable capsules are such that they remain substantially intact at pressures of about 10 kg/cm$^2$ or below but are ruptured at pressures of about 500 kg/cm$^2$ or less.

The pressure characteristics can be controlled depending upon the particle size of the capsules, the thickness of the capsule walls, and the material used as the capsule walls.

The capsules are coated onto a support in amounts such that the coating weight of the color image forming material is in the range of from about 0.1 to about 5 g/m$^2$.

In accordance with the present invention, binders may be used either alone or in combination. Hydrophilic binders may primarily be used. Typical hydrophilic binders are either transparent or translucent, and they include natural substances such as proteins (gelatin, gelatin derivatives and cellulose derivatives) and polysaccharides (e.g., starch and gum arabic), and synthetic polymeric substances such as water-soluble polyvinyl compounds (e.g., polyvinylpyrrolidone and acrylamide polymers). Other synthetic polymeric substances are latexes, espcially dispersed vinyl compounds capable of enhancing the dimensional stability of photographic materials.

The binder used for the light-sensitive material or image receiving material in the present invention is applied in amounts of from about 0.01 to 10 g/m$^2$.

The supports which are used with the light-sensitive material in accordance with the present invention, and those which are used with optional image receiving materials must be sufficiently heat resistant to withstand the temperature used in the development processing. Common support materials such as glass, paper, metals and analogues thereof may be used. Other suitable supports are acetylcellulose films, cellulose ester films, polyvinyl acetal films, polystyrene films, polycarbonate films, polyethylene terephthalate films, as well as other films and resin materials associated with these films. Paper supports laminated with polymers such as polyethylene may also be used. Preferred support materials are the polyesters described in U.S. Pat. Nos. 3,634,089 and 3,725,070.

The light-sensitive material in accordance with the present invention may optionally incorporate auxiliary layers such as a protective layer, intermediate layer, anti-static layer, anti-curl layer, peeling layer, and matting agent containing layer. In order to avoid blocking problems, organic or inorganic matting agents are desirably incorporated in the protective layer.

The light-sensitive material and optional image receiving material may also contain antifoggants, brighteners, anti-fading agents, dyes to prevent halation or irradiation, pigments, water releasers to releasing water during heating, agents to prevent thermal polymerization, surfactants, and hot solvents to assist the transfer of the substances in the reaction system which are solid at ordinary temperature and are in melted state when heated.

A variety of exposure means may be employed in the present invention. Latent images are obtained by imagewise exposure to various sources of radiation including visible light. Common light sources may be used, such as sunlight, flash lamps, electronic flashes, tungsten lamps, mercury lamps, halogen lamps such as iodide lamps, xenon lamps, lasers, CRT light sources, plasma light sources, fluorescent lamps and light emitting diodes (LED). Exposure means combining linear or planar light sources with micro-shutter arrays using liquid-crystal display (LCD) or lanthanum doped lead titano-zirconate (PLZT) may also be used. The particular type of light sources and the amount of exposure may be selected depending upon the sensitivity of the silver halides and the wavelength at which they are spectrally sensitized by dyes.

The original that is used in the present invention may be black-and-white or colored. The original may be line images prepared in mechanical drawing or may be photographic images having tone gradation. Portraits or other still pictures taken by cameras may also be used as the original. Printing from an original may be accomplished either by contact printing, relfection printing, or by enlargement printing.

Images recorded by video cameras and other video information broadcast from TV stations may be directly displayed on a CRT (Cathode Ray Tube) or FOT (Fiber Optical Tube) and focused on the light-sensitive material by contact printing or though a lens system.

Light emitting diodes (LEDs) have seen rapid advancement in technology and are gaining acceptance for use in a variety of apparatuses as exposure or display means. It is, however, difficult to have a blue light effectively issued from a single LED. Therefore, in order to reproduce color images, three LEDs emitting green, red and infrared lights are prepared, and emulsions sensitive to these lights are so designed that they respectively contain yellow, magenta, and cyan image forming materials. More specifically, a yellow image forming material is incorporated in the green-sensitive emulsion, a magenta image forming material in the red-sensitive emulsion, and a cyan image forming material in the infrared-sensitive emulsion. Other combinations may of course be selected depending upon the specific need.

In addition to the methods described above for printing the original by direct contact or projection onto a screen, the following techniques may also be used: the original illuminated by a light source can be read by a light receiving device such as a photoelectric tube or charge-coupled device (CCD) and loaded into a memory in a computer, etc., and the stored information is subjected to "video processing" as required, and the so obtained video information is reproduced on a CRT for subsequent use as an imagewise light source. Alternatively, the processed information may be immediately used to activate the three LEDs described above for exposure purposes.

Any of the known methods may be employed in order to heat the light-sensitive material after it has been subjected to imagewise exposure in accordance with the present invention. For example, the light-sensitive material may be brought into direct contact with a hot plate or heated drum or may be passed through heated rollers. Other heating sources include heated air, rf (radio frequency) heating and laser beams. Some types of the light-sensitive materials may be heated by an infrared heater. Another heat source is the eddy currents produced by electromagnetic induction.

The light-sensitive material may also be dipped in a bath containing heated liquid materials such as fluorine compounds that are inactive to the light-sensitive material.

Instead of using such external heating elements, the light-sensitive material in accordance with the present invention may be heated by an internally incorporated heating source. For example, a layer of electroconductive particles of carbon black, graphite, etc., can be incorporated in the light-sensitive material and an electric current passed through it to produce heat. When such an internal heating source is used, the heating temperature generally ranges from 80° to 200° C., and preferably from 100° to 160° C.

A variety of profiles may be used in heating the light-sensitive material. The most common profile is heating at a constant temperature. Depending on the characteristics of the particular light-sensitive material, a multistage heating may effectively be used, wherein it is first heated at high temperatures for a short period and then is allowed to cool gradually. In this case, the heating period generally ranges from 5 seconds to 5 minutes, and preferably from 5 seconds to 1 minute.

If aerial oxidation during heating should be avoided, the space around the heating element is preferably evacuated or replaced by an inert gas. If the light-sensitive material is of an appropriate type, its surface may be placed in direct contact with the heating element or it may be exposed to the air. If the light-sensitive material is developed with its surface exposed to the air, a cover may be provided and this is effective for the purpose of heat insulation or preventing the evaporation of water or volatile components from within the light-sensitive material.

In accordance with the present invention, the light-sensitive material that has been subjected to imagewise exposure is heated to form an imagewise pattern of the polymeric compound (or high molecular polymer) and is subsequently processed by a suitable method to form a color image. In one embodiment, areas wherein no polymeric compound has formed are washed off to render the color image visible. In this case, the particular solvent used in the washing off operation may be selected depending upon the properties of the polymerizable compound and the color image forming material. Solvents that are generally used in the wash off step include water, aqueous alkaline solutions, aqueous solutions of mineral acids, alcohols, acetone, acetonitrile, dimethylformamide and methyl cellosolve.

In another embodiments where a color image forming material that develops color upon contact with two or more components is used, the components are incorporated in the light-sensitive material in a manner separate from each other either within the same layer or within different layers and such components may be brought into contact with each other by causing the light-sensitive material to pass between pressure or heated rollers, thereby producing a color image.

In still another embodiment, the light-sensitive material is superimposed on an image receiving material, and the combination is passed through pressure or heated rollers so that the color image forming material present in areas where no polymeric compound has formed is transferred onto the image receiving material, producing the desired color image. In this case, any other components that are necessary for color development may be incorporated in the image receiving layer by coating them onto a support by any of the methods described above in connection with the fabrication of the light-sensitive material.

The following Examples are provided for further illustration of the method of recording an image in accordance with the present invention. All parts and percentages in these examples are by weight, unless otherwise indicated.

EXAMPLE 1

The solutions indicated below were applied to a polyethylene terephthalate film in an amount of 35 ml/m$^2$ using a coating rod No. 20 and the applied coatings were dried with air supplied at 70° C.

The first coating solution applied was a dispersion consisting of methanol (20 ml), polyvinylpyrrolidone (3 g), acrylamide (2 g), methylene bisacrylamide (0.25 g) and silver behenate (1.44 g) prepared from behenic acid (2 mols) and silver nitrate (1 mol).

Then, a solution having m-dimethylaminophenol (137 mg), ammonium bromide (2.5 mg) and ammonium iodide (0.2 mg) dissolved in methanol (5 ml) was applied to the first coating.

After drying the second coating, a third coating was formed by applying a solution containing 4% gelatin, 1% sodium laurylbenzenesulfonate and formaldehyde sodium bisulfite in respective amounts of 100 g, 1 g and 0.001 g, and the applied coating was dried to provide a recording material.

With half its area covered with black paper, the recording material was exposed for 2 seconds to a fluorescent lamp (60 w) at a distance of 1 m, forming latent image specks in the exposed areas. None of the exposed areas were found to have blackened as a result of printing out. The exposed material was held between hot plates at temperatures of 85° to 90° C. for a period of about 30 seconds. Thereafter, the material was strongly washed off in a methanol bath. At tested temperatures between 85° and 90° C., a strong film remained intact only in the exposed areas, demonstrating the occurrence of selective polymerization reaction in those areas. When the heating temperature was as low as about 65° C., an image could be obtained only by extending the heating period to about 3 minutes.

EXAMPLE 2

A recording material was prepared as in Example 1, except that m-dimethylaminophenol was used as a mixture with polyvinylpyrrolidone and that no gelatin was used. The prepared recording material was tested as in Example 1 and was found to produce a strong film in the exposed areas.

EXAMPLE 3

A recording material was prepared as in Example 2, except that 0.006 g of formaldehyde sodium bisulfite was used in admixture with m-dimethylaminophenol. Good results were obtained with this recording material. Results which were substantially the same as those of Example 2 were also obtained when the formaldehyde sodium bisulfite was increased to 0.06 g.

From the results obtained, it has been found that the dynamical strength of the film remained after washing off when used the formaldehyde sodium bisulfite is higher than the case when the formaldehyde sodium bisulfite is not used. Further, the strength is dependent upon the amount of the formaldehyde sodium bisulfite used.

EXAMPLE 4

A recording material was prepared in Example 3, except that the formaldehyde sodium bisulfite was replaced by benzaldehyde or cyclohexanone sodium bisulfite. The results with this recording material were as good as those obtained in Example 1.

EXAMPLE 5

This Example illustrates the use of a conventional photographic developing agent in combination with a reducing agent.

A recording material was prepared as in Example 4, except that 1-phenyl-3-pyrazolidone was used in an amount of 0.1 wt% based on the weight of the m-dimethylaminophenol and that the duration of exposure was extended to 30 seconds. The results were substantially the same as obtained in Example 4, and this was also true with the case where the 1-phenyl-3-pyrazolidone was replaced by 0.01 wt% of catechol.

EXAMPLE 6

A recording material was prepared as in Example 1, except that 6,6-nylon was used in an amount of 20 wt% based on the weight of the polyvinylpyrrolidone. When the exposed material was heated at between 115° and 120° C. for about 20 seconds, a polymeric compound was found to occur only in the exposed areas.

EXAMPLE 7

Tetraethylene glycol dimethacrylate (1.87 ml), polyvinylpyrrolidone, K-90 (2.0 g), silver behenate (0.96 g), an adduct of sodium hydrogensulfite and aldehyde (0.001 g) and varying amounts (0.4 to 1.73 g) of zinc oxide were dispersed in methanol (20 ml). The dispersion was applied to a polymeric support with a coating rod No. 20 and the applied coating was dried with heat. Subsequently, a solution having m-dimethylaminophenol (500 mg), catechol (0.04 mg), ammonium bromide (10 to 20 mg) and ammonium iodide (0.5 to 1 mg) dissolved in methanol (5 ml) was applied and dried with heat.

The second coating was wetted with a solution made of a mixture of 4% gelatin (10 ml) and 1% sodium lauryl benzenesulfonate (1 ml) and dried. The so prepared recording material was exposed as in Example 5 and subsequently treated as in Example 6. For each of the tested amounts of zinc oxide, ammonium bromide, and ammonium iodide, a sharp image was obtained by rinsing the processed material in hot water (50° to 60° C.).

The same results were obtained when the water bath was replaced by a methanol bath.

EXAMPLE 8

A mixture of acrylamide (2 g), methylene bisacrylamide (0.25 g), silver behenate (0.8 g), 1,4-bismethylaminoanthraquinone (0.5 g), polyvinylpyrrolidone (3 g) and methanol (30 ml) was dispersed in a high speed shear agitator at 10,000 rpm for 10 minutes.

The resulting dispersion was coated onto a polyethylene terephthalate film to give a wet thickness of 60 μm and dried.

Subsequently, a mixture of m-dimethyl aminophenol (130 mg), ammonium bromide (2.5 g), and ammonium iodide (0.5 mg) was dissolved in methanol (5 ml) and the resulting solution was coated onto the web and dried. To the resulting coat, a mixture of 4% aqueous gelatin (100 g), 1% aqueous solution of sodium dodecylbenzenesulfonate (2 ml) and an addition product of formaldehyde and sodium bisulfite (0.1 g) was applied and dried, thus providing a light-sensitive material.

This material was subjected to imagewise exposure to a tungsten lamp (2,000 lux) for 5 seconds. Thereafter, the material was heated on a hot plate (90° C.) for 30 seconds.

The developed material was thoroughly washed in a methanol bath, producing a sharp blue image in a pattern corresponding to the exposed areas.

EXAMPLE 9

A polycondensation product of p-phenylphenol and formaldehyde (3 g), sodium 2-ethylhexylsulfosuccinate (0.5 g), phenyl xylyl ethane (5 g) and ethyl acetate (20 ml) were mixed and heated at 50° C. to form a uniform solution. The solution was mixed under agitation with 100 g of 4% aqueous gelatin and the mixture was treated in a high speed shear agitator as in Example 8. The resulting dispersion (30 g) was coated onto a polyethylene terephthalate film to give a wet thickness of 30 μm and dried.

To the resulting coat, a mixture of 4% aqueous gelatin (100 ml) and a 1% aqueous solution (4 ml) of sodium 2-ethylhexylsulfosuccinate was applied to form a coat having a wet thickness of 10 μm and dried. This second coat was overlaid with a coating of a wet thickness of 30 μm that was formed by applying a dispersion of N,N-dibutylacrylamide (2 g), methylene bisacrylamide (0.25 g), silver behenate (0.8 g), Crystal Violet Lactone (0.6 g), polyvinylpyrrolidone (3 g), phenyl xylyl ethane (3 g), sodium 2-ethylhexylsulfosuccinate (0.5 g) and 4% aqueous gelatin (50 ml). The dispersion was prepared in the same manner as described above. After drying the third coating, a fourth coat was applied from a solution of m-dimethylaminophenol (130 mg), ammonium bromide (2.5 mg), and ammonium iodide (0.5 mg) in methanol (5 ml). Upon drying the fourth coat, a light-sensitive material was obtained.

This light-sensitive material was subjected to imagewise exposure under a tungsten lamp (2,000 lux) for 5 seconds, and subsequently heated on a hot plate (90° C.) for 30 seconds. The heated material was then passed through heated (80° C.) pressure rollers, producing a sharp blue image in a pattern corresponding to the unexposed areas.

EXAMPLE 10

Preparation of Image Receiving Material

Precipitated calcium carbonate (65 parts), aluminum hydroxide (35 parts, product of Showa Denko K.K.), a ground mixture of a decamer of styrene/α-methyl styrene (1.8 parts) and zinc 3,5-di-α-methylbenzyl salicylate (8.2 parts), zinc oxide (10 parts) and sodium hexametaphosphate (1 part) were dispersed in water (200 ml). The dispersion was treated in a sand mill to provide an aqueous dispersion having an average particle size of 2.6 μm. To the dispersion, polyvinyl alcohol (9 parts), 48% carboxy-modified SBR latex (20 parts) and water (110 parts) were added and stirred thoroughly.

The well stirred dispersion was applied to raw paper (basis weight: 43 g/m$^2$) to provide a coating having a solids content of 5.2 g/m$^2$, which was subsequently dried at 90° C.

Preparation of Light-Sensitive Material

Silver behenate (15 g) was suspended in methanol (200 ml) in a dark room. To the suspension, a solution having ammonium bromide (20 mg) and ammonium iodide (5 mg) dissolved in methanol (10 ml) was added in small portions. The mixture was vigorously agitated for 10 minutes, and the resulting precipitate was recovered by filtration to obtain a light-sensitive silver behenate emulsion.

A portion (2 g) of the silver behenate emulsion, N,N'-diacryloylpiperazine (5 g), pentaerythritol tetraacrylate (3 g), Crystal Violet Lactone (0.5 g), phenyl xylyl ethane (6 g), a 3/1 adduct of tolylene diisocyanate and trimethylolpropane (1 g), a ¼ adduct of ethylenediamine and propylene oxide (0.3 g) and ethyl acetate (4 ml) were mixed to form a solution.

This solution was mixed with a solution of polyvinyl alcohol (3 g) in water (30 ml) and a dispersion was made from the mixture as in Example 1. To the dispersion, 100 ml of water was added under agitation and the mixture was heated at 50° C. for 2 hours to obtain capsules having an average size of 10 μm. A coating solution was prepared by adding 5% SBR (styrene-butadiene rubber) to the dispersion of capsules, and applied to a polyethylene terephthalate film to form a coat having a wet thickness of 40 μm and dried.

A mixture of a solution of m-dimethyl aminophenol (250 mg) in methanol (5 ml), a 1% aqueous solution of sodium dodecylbenzenesulfonate (1 ml), an adduct of formaldehyde and sodium bisulfite (5 mg) and 4% aqueous gelatin (30 ml) was subsequently applied and dried to provide a light-sensitive material.

This light-sensitive material was subjected to imagewise exposure under a tungsten lamp (2,000 lux) for 5 seconds and heated on a hot plate (90° C.) for 30 seconds.

The heated light-sensitive material was superimposed on the previously prepared image receiving material and the combination was passed through pressure rollers, producing a sharp blue image in a pattern corresponding to the unexposed areas.

EXAMPLE 11

A silver halide emulsion (2 g) containing 10 wt% of silver chlorobromide (Cl/Br molar ratio: 1/1) and 7 wt% of gelatin was mixed with diethyl aminophenol (0.03 g), sorbitol (0.1 g), 5 wt% aqueous solution of sodium p-dodecylbenzenesulfonate (0.1 g), pentaerythritol tetraacrylate (1 g), 1,4-bismethylaminoanthraquinone (0.5 g) and water. The resulting mixture was emulsified in an ultrasonic emulsifier for 1 hour, and the emulsion was applied to a polyethylene film to give a coat having a dry thickness of ca. 10 μm and subsequently dried to provide a light-sensitive material.

The light-sensitive material was subjected to an imagewise exposure under a halogen lamp (2,000 lux) for 10 seconds, and subsequently heated on a hot plate (120°) for 30 seconds.

The heated material was thoroughly washed off with a mixture of ethanol (2 parts) and water (1 part), producing a sharp blue image in a pattern corresponding to the exposed areas.

EXAMPLE 12

Preparation of Benzotriazole Silver Emulsion

Benzotriazole (6.5 g) and gelatin (10 g) were dissolved in water (1,000 ml). The solution was agitated at a controlled temperature of 50° C.

A solution of silver nitrate (8.5 g) in water (100 ml) was added to the benzotriazole solution over a period of 2 minutes.

The mixture was pH adjusted to form a precipitate, and the unwanted salts were removed. The precipitate was adjusted to a pH of 6.0 so as to obtain a benzotriazole silver emulsion in a yield of 400 g.

Preparation of Silver Iodobromide Emulsion

Gelatin (20 g), KBr (9.52 g) and KI (3.32 g) were dissolved in H$_2$O (1,000 ml). The solution was agitated at a controlled temperature of 50° C.

To the stirred solution, a solution of AgNO$_3$ (17 g) in H$_2$O (100 ml) was added over a period of 10 minutes. Thereafter, the mixture was cooled at 35° C. and pH adjusted to form an emulsion precipitate, followed by removal of excess salts.

By subsequent adjustment to a pH of 6.0, an AgBrI (I=20 mol%) emulsion was obtained in a yield of 200 g.

Preparation of Packet Emulsion 5 g of N,N'-diacryloylpiperazine, pentaerythritol tetraacrylate (3 g), 3,3-bis(1-ethyl-2-methyl-3-indolyl)phthalide (1 g), phenyl xylyl ethane (10 ml) and tricresyl phosphate (10 ml) were mixed to form a solution. The solution was emulsified in 110 g of 10% aqueous gelatin containing 0.5 g of sodium dodecylbenzenesulfonate, thereby forming a dispersion of color image forming material.

To 4 g of the previously prepared silver iodobromide emulsion, a methanol solution of 3,3'-di(γ-sulfopropyl)-5,5'-diphenyl-9-ethyloxacarbocyanine sodium salt (4×10$^{-4}$ mol per mol of silver halide) was added, and the mixture was stirred for 5 minutes. To the stirred mixture, 20 g of the previously prepared dispersion of color image forming material (20 g) and the benzotriazole silver emulsion (30 g) were added, followed by intimate mixing.

To the mixture, 30 ml of a 10% aqueous gum arabic solution and 100 ml of water were added, and the pH was adjusted to 4.80 with 1% aqueous acetic acid solution under agitation at 45° C. Following a 15 minute agitation, the mixture was cooled to 7° C. and stirred for another 30 minutes. To the stirred mixture, 150 ml of water containing 0.14 g of chrome alum was added, and after 1 hour stirring, a 5% aqueous solution of sodium carbonate was added. Following standing overnight, the supernatant was removed by decantation. A packet emulsion was obtained in a yield of 90 g and it had an average grain size of about 10 μm.

Preparation of Light-Sensitive Material
(green-sensitive)

A coating solution containing the packet emulsion was applied to a polyethylene terephthalate film to form a coat having a wet thickness of 50 μm. After drying, the emulsion coat was overlaid with a protective gelatin coat (containing 1 g/m² of gelatin and 0.5 g/m² of m-dimethylaminophenol) to provide a light-sensitive material.

This material was exposed to a green light through a filter and uniformly heated at 100° C. for 40 seconds. The heated light-sensitive material was superimposed on an image receiving material of the same type as prepared in Example 10. The combination was passed through pressure rollers, producing a sharp magenta image in a pattern corresponding to the unexposed areas.

EXAMPLE 13

A red light-sensitive material was provided as in Example 11 except that the sensitizing dye and color image forming material used in the preparation of packet emulsion were respectively 3,3'-di(γ-sulfopropyl)-9-methylthiadicarbocyanine sodium salt and 3,6-dimethoxyfluoran.

The light-sensitive material so provided was exposed to a red light and heated at 100° C. for 40 seconds. The heated material was superimposed on an image receiving material of the same type as used in Example 10, and the combination was passed through pressure rollers, producing a sharp yellow image in a pattern corresponding to the unexposed areas.

While the invention has been described in detail and with reference to specific embodiments thereof, it will be apparent to one skilled in the art that various changes and modifications can be made therein without departing from the spirit and scope thereof.

What is claimed is:

1. An image forming method which comprises forming a latent image by imagewise exposing a recording material including a light-sensitive silver salt, a reducing agent, a polymerizable compound having at least one carbon-carbon unsaturated bond, and a binder, on a suport, and subsequently subjecting said recording material to a substantially uniform heating at about 80° C. or more under conditions substantially not containing water, thereby forming a polymeric compound in areas where the latent image of the light-sensitive silver salt has formed.

2. An image forming as in claim 1, wherein the light-sensitive silver salt is present in an amount of from 1 mg to 10 g/m², as silver, the reducing agent is present in an amount of from 0.1 to 1,500 mol%, based on the total mols of the light-sensitive silver salt, and the polymerizable compound is present in an amount of from 5 to 120,000 wt%, based on the total weights of the silver in the light-sensitive silver salts.

3. An image forming method as in claim 1, wherein the recording material further contains a silver salt oxidizing agent, the total amount of the light-sensitive silver salt and silver salt oxidizing agent is in a range of 1 mg to 10 g/m², as silver.

4. An image forming method as in claim 1, wherein the binder in the recording material is present in an amount of from 0.01 to 10 g/m².

5. An image forming method as in claim 1, wherein the recording material contains a color image forming material.

6. An image forming method as in claim 5, wherein the color image forming material is a dye or a pigment.

7. An image forming method as in claim 6, wherein the color image forming material is a component in a coloration system, which develops color upon an acid base reaction, an oxidation reduction reaction, a coupling reaction or a chelate forming reaction.

8. An image forming method as in claim 3, wherein silver salt oxidizing agent is used in an amount ranging from 0.01 to 10 mols per mol of light-sensitive silver halide.

9. An image forming method as in claim 1, wherein the recording material contains a base or base precursor.

10. An image forming method which comprises forming a latent image by imagewise exposing a recording material including a light-sensitive silver salt, a reducing agent, a polymerizable compound having at least one carbon-carbon unsaturated bond, a binder, and a first color component capable of causing a coloration reaction with a second color component, on a support; subjecting said recording material to a substantially uniform heating at about 80° C. or more under conditions substantially not containing water to form a polymeric compound in areas where a latent image of the light-sensitive silver salt has formed; and reacting the first color component present in areas where the polymeric compound has not been formed with a second color component to form color in a receiving element containing the second color component.

11. An image forming method as in claim 10, wherein the light-sensitive silver salt is present in an amount of from 1 mg to 10 g/m², as silver, the reducing agent is present in an amount of from 0.1 to 1,500 mol%, based on the total mols of the light-sensitive silver salts, and the polymerizable compound is present in an amount of from 5 to 120,000 wt%, based on the total weights of the silver in the light-sensitive silver salts.

12. An image forming method as in claim 10, wherein the recording material further contains a silver salt oxidizing agent, the total amount of the light-sensitive silver salt and silver salt oxidizing agent is in a range of 1 mg to 10 g/m², as silver.

13. An image forming method as in claim 12, wherein silver salt oxidizing agent is used in an amount ranging from 0.01 to 10 mols per mol of light-sensitive silver halide.

14. An image forming method as in claim 10, wherein the recording material contains the binder in an amount of from 0.01 to 10 g/m².

15. An image forming method as in claim 10, wherein the color component in the recording material is present in an amount of from 0.1 to 5 g/m² in the coloration state.

16. An image forming method as in claim 10, wherein the first color component is a color former and the second color component is a color developer.

17. An image forming method as in claim 10, wherein the receiving element containing the color component is supported on a support which is different from the support having a recording material thereon.

18. An image forming method as in claim 1, wherein the polymerizable compound is a compound selected from the group consisting of acrylic acid and salts thereof, acrylic acid esters, acrylamides, methacrylic acid and salts thereof, methacrylic acid esters, methacrylamides, maleic anhydride, maleic acid esters, itaconic acid esters, styrenes, vinyl ethers, vinyl esters and N-viny heterocyclic compunds.

19. An image forming method as in claim 10, wherein the polymerizable compound is a compound selected from the group consisting of acrylic acid and salts thereof, acrylic acid esters, acrylamides, methacrylic acid and salts thereof, methacrylic acid esters, methacrylamides, maleic anhydride, maleic acid esters, itaconic acid esters, styrenes, vinyl ethers, vinyl esters and N-vinyl heterocyclic compounds.

* * * * *